United States Patent [19]
Chi

[11] Patent Number: 5,863,841
[45] Date of Patent: Jan. 26, 1999

[54] PLASMA DIFFUSION CONTROL APPARATUS

[75] Inventor: Kyeong-koo Chi, Seoul, Rep. of Korea

[73] Assignee: Samsung Electronics Co., Ltd., Suwon, Rep. of Korea

[21] Appl. No.: 42,730

[22] Filed: Mar. 17, 1998

Related U.S. Application Data

[62] Division of Ser. No. 698,362, Aug. 15, 1996.

[30] Foreign Application Priority Data

Aug. 16, 1995 [KR] Rep. of Korea ............ 95-25125

[51] Int. Cl.$^6$ .............. H05H 1/02; H01L 21/00
[52] U.S. Cl. .......................... 438/732; 427/571
[58] Field of Search ............ 118/723 MR, 723 MA; 156/345; 204/298.16, 298.37; 438/728, 732; 427/569, 571

[56] References Cited

U.S. PATENT DOCUMENTS

| | | | |
|---|---|---|---|
| 3,643,123 | 2/1972 | Haeff | 313/162 |
| 4,740,268 | 4/1988 | Bukhman | 156/643 |
| 5,032,205 | 7/1991 | Hershkowitz | 156/345 |
| 5,045,166 | 9/1991 | Bobbio | 204/192.32 |

*Primary Examiner*—R. Bruce Breneman
*Assistant Examiner*—Luz Alejandro
*Attorney, Agent, or Firm*—Jones & Volentine, L.L.P.

[57] ABSTRACT

A plasma diffusion control apparatus is provided with a plurality of wires through which current flows in parallel so that lines of magnetic force are generated in a direction parallel to the plasma wall of the diffusion chamber wall. It is preferable that the wires are located in the neighborhood of the diffusion chamber at equal intervals, and arranged so that the direction of the magnetic field generated by wires are parallel to the direction of movement of the plasma. Since the magnetic field is formed in a direction parallel to the inner wall of the diffusion chamber, it is possible to prevent the diffusion of the plasma to the chamber wall. As a result there is no region which is influenced by strong local magnetic fields perpendicular to the plasma chamber wall, so that it is possible to solve the problems caused by substantial amounts of polymer deposition on the inner wall of the plasma diffusion chamber.

8 Claims, 6 Drawing Sheets

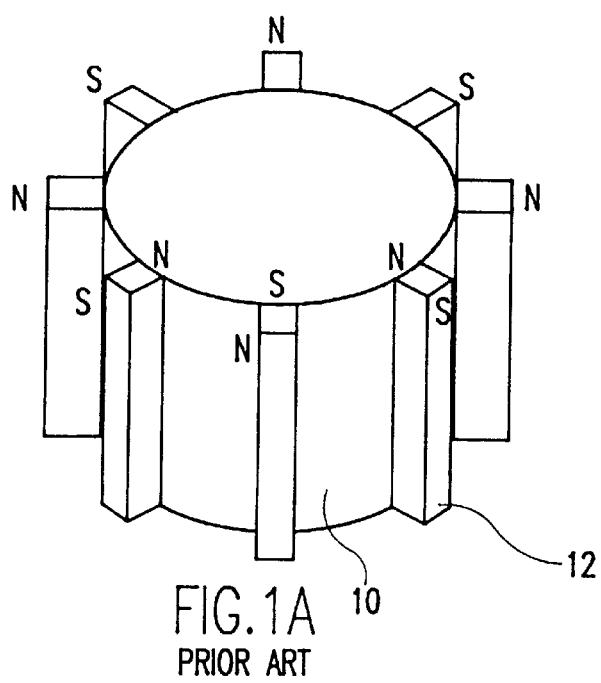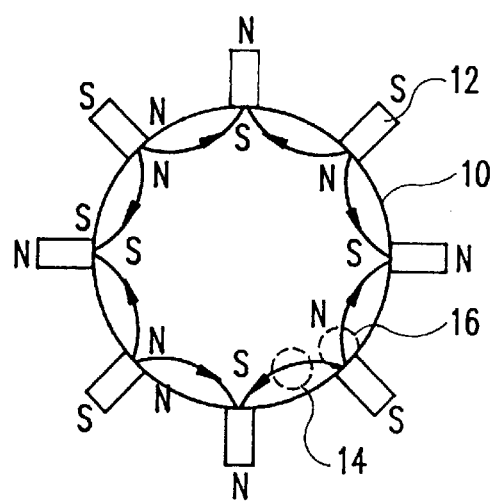
FIG. 1A
PRIOR ART
FIG. 1B
PRIOR ART

PLASMA DIFFUSION CONTROL APPARATUS

CROSS REFERENCE TO RELATED APPLICATIONS

This is a divisional application of application Ser. No. 08/698,362, filed Aug. 15, 1996.

TECHNICAL FIELD

The present invention relates to a semiconductor fabrication apparatus, and more particularly, to a plasma diffusion control method and apparatus for use in a plasma etching apparatus.

BACKGROUND OF THE INVENTION

In widely used etching methods for etching a semiconductor device, a plasma from a plasma source is often supplemented by plasma generated by using an additional plasma generating apparatus so that the generated plasma diffuses toward the location of a wafer to be etched, thereby etching layers on the wafer. The diffusion technique is carried out with etching equipment used to produce highly integrated semiconductor devices. Such equipment includes electron cyclotron resonance etchers, inductively coupled plasma etchers and helicon wave plasma etchers, all of which are characterized as low pressure, high density plasma equipment.

However, when diffusing plasma in order to move the plasma generated from an extra plasma source, plasma density rapidly lowers in the neighborhood of the wafer to be etched due to the diffusion of the plasma. This is true even though the plasma is generated at high densities. Also, since at the time of diffusion the mobility of electrons is more than $10^3$ times greater than that of ions, the number of electrons lost from the plasma is greater than that of lost ions, thereby raising the potential of the plasma. In order to prevent this phenomenon, the conventional technique is to install multiple permanent magnets around the diffusion chamber to maintain the plasma density.

FIGS. 1A and 1B are a perspective view and a plan view respectively, of a conventional plasma diffusion chamber. Reference numbers 10 and 12 denote respectively, a diffusion chamber wall and permanent multi-magnets attached to the chamber wall. However, with conventional methods, at the location indicated by reference number 14, the direction of the magnetic field is on a plane parallel to the chamber wall. As a result, the reflection of the plasma by the magnetic field is fully realized. In contrast the magnetic flux is configured in a direction perpendicular to the surface of the chamber at the location indicated by reference number 16. As a result the plasma proceeds along the direction of the magnetic flux thereby accelerating the attachment of polymer to the plasma chamber wall. FIG. 2 is a photograph showing the polymer attached to the chamber wall as a result of using conventional methods. The polymer attached to the chamber wall becomes a source of dust during the etching process. Consequently, the yield of the etched semiconductor devices is lowered and the operation rate of the equipment and its life span are reduced.

SUMMARY OF THE INVENTION

It is an object of the present invention to provide a plasma diffusion control method and apparatus that is capable of solving one or more of the problems identified in the prior conventional diffusion methods.

It is an object of the present invention to provide a plasma diffusion control apparatus which maintains plasma density during the plasma diffusion control process.

It is another object of the present invention to configure plasma flow in a desired pattern.

It is a further object of the present invention to avoid buildup of polymer on the interior wall of a plasma diffusion chamber.

It is yet another object of the present invention to enhance the efficiency of the plasma etching process.

It is yet a further object of the present invention to increase the equipment life span in a diffusion etching system.

It is still another object of the present invention to limit the introduction of contaminants during a plasma diffusion etching process.

These and other objects of the present invention are achieved by an embodiment of the present invention including a method of controlling plasma diffusion in a plasma chamber. This method includes the steps of generating a plasma flow within the plasma chamber and generating a magnetic field parallel to the wall of the plasma chamber.

In another aspect of the present invention the objects are achieved by plasma diffusion control system having a plasma chamber with a wall. Included is a device for generating a magnetic field in a direction parallel to the wall of the plasma chamber.

According to the present invention, the magnetic field formed in a direction parallel to an inner wall of the diffusion chamber prevents the plasma from diffusing to the chamber wall. Since there is no region which is influenced by a locally strong magnetic field, it is also possible to solve the conventional problem that a considerable amount of polymer on the inner wall of the diffusion chamber is locally deposited.

BRIEF DESCRIPTION OF THE DRAWINGS

The above objects and advantages of the present invention will become more apparent by describing in detail a preferred embodiment thereof with reference to the attached drawings in which:

FIG. 1A is a perspective view of a conventional plasma diffusion chamber;

FIG. 1B is a plan view of a conventional plasma diffusion chamber;

DETAILED DESCRIPTION OF THE INVENTION

Figure 2:
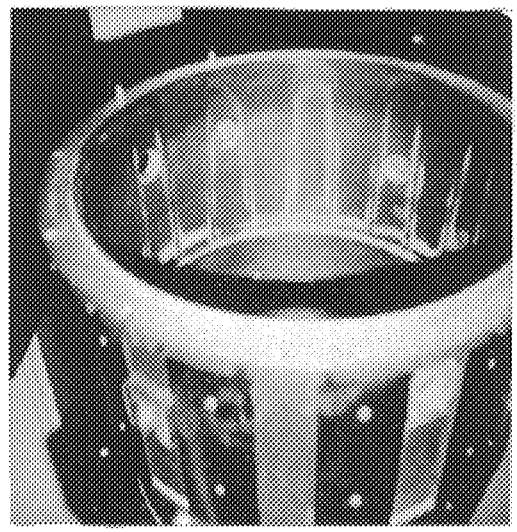
FIG. 2 is a photograph depicting polymer attached to the plasma chamber wall as a result of using conventional diffusion methods.
Figure 3A:
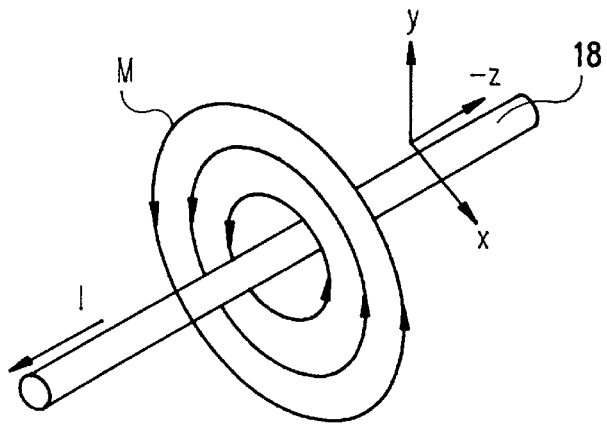
FIG. 3A is a perspective view depicting the shape of a magnetic field induced in a wire when current flows along that wire.
Figure 3B:
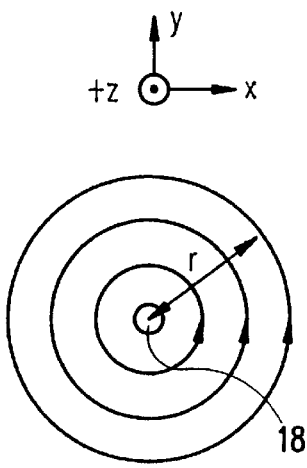
FIG. 3B is a plan view depicting the shape of a magnetic field induced in a wire when current flows along that wire.

FIGS. 3A and 3B are perspective and plan views respectively, showing the shape of a magnetic field M induced in a wire when current flows along that wire.

As shown in FIGS. 3A and 3B, when current I flows along a straight wire 18, the magnetic field M induced in the neighborhood of the wire is generated in a concentric direction centered at the wire on a plane perpendicular to the wire. The strength of magnetic field B is expressed as follows:

$$B = \frac{2I}{cr} \text{ (cgs unit)}$$

where r denotes the distance from the center of the wire and c is the speed of light or $3 \times 10^{10}$ cm/sec. Magnetic field strength B is most often expressed in Webers per square meter, or in Newtons per ampere-meter. As depicted in FIG. 3B the direction of magnetic field B runs counterclockwise around conductor 18 when current I moves in the +z direction (out of the drawing towards the viewer).

Figure 4:
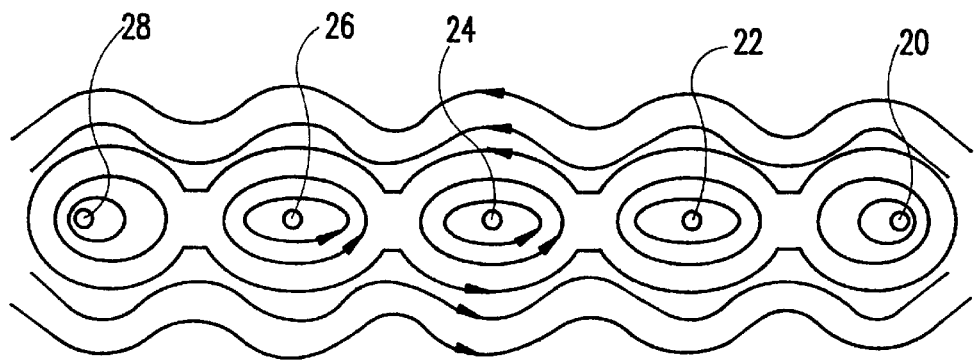
FIG. 4 is a plan view depicting the shape of a magnetic field formed when current flows in the same direction along a plurality of adjacent, parallel wires.

When a plurality of parallel wires are adjacently arranged and currents flow through each wire in the same direction, the shape of the composite magnetic field formed in the neighborhood of the wires is shown in FIG. 4. Reference numbers 20, 22, 24, 26 and 28 denote wires through which the currents flow to form the composite magnetic field. In this arrangement, there are no portions where superimposed magnetic field lines are sunk or originated. Thus, there are no strong local magnetic fields perpendicular to the wall of the plasma chamber. This is different from conventional systems which employ permanent magnets arranged around a plasma diffusion etching chamber.

With the arrangement of FIG. 4 a change in the strength of the magnetic field is generally slow, and there is no region of the plasma chamber which is adversely influenced by strong magnetic field variation.

Figure 5:
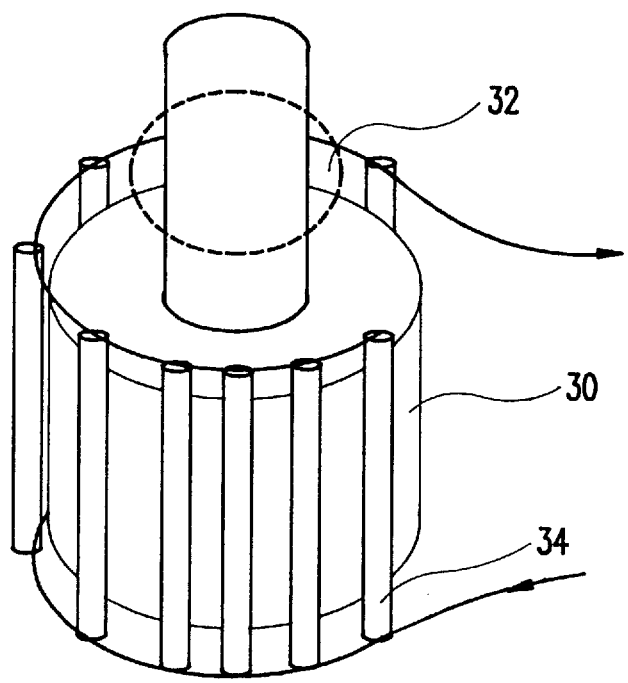
FIG. 5 is a perspective view of an apparatus with a plurality of adjacent, parallel wires mounted around the outer wall of a plasma diffusion chamber according to the present invention.

FIG. 5 depicts an apparatus with a plurality of adjacent, parallel wires arranged around the outer wall of the plasma diffusion etching chamber according to the present invention. Reference numbers 30, 32 and 34 respectively denote a plasma diffusion chamber wall, a plasma generation region and one of the parallel wires through which the current flows. The supply wires indicated by arrows in FIG. 5 carry current to the parallel wires.

Each of the two supply wires connects opposite ends of the parallel wires together. As suggested by the combined magnetic field depicted in FIG. 4, the magnetic field resulting from the arrangement of FIG. 4 is formed in a direction parallel to the wall of the plasma diffusion chamber. This prevents the diffusion of the plasma to the chamber wall. Also, since there is no region which is influenced locally by a strong magnetic field in a direction perpendicular to the plasma chamber wall, there is no magnetic force pushing the plasma against the chamber wall. As a result, there is no polymer deposited on the inner wall of the plasma diffusion chamber. Not only do the plurality of parallel wires 34 arranged on the outer wall of the diffusion chamber avoid magnetic fields perpendicular to the chamber wall but they also induce a screening layer of magnetic field holding the plasma away from the plasma chamber wall.

Figure 6:
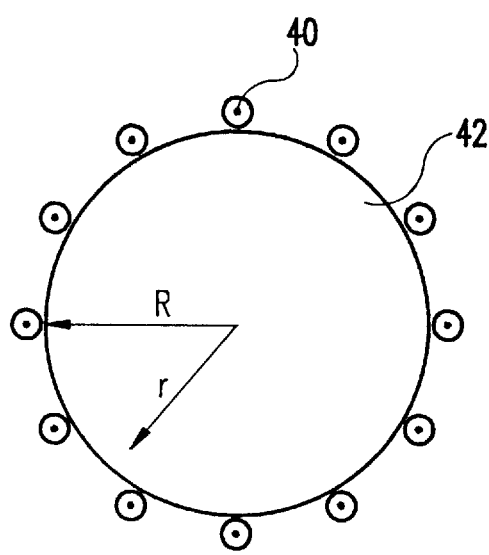
FIG. 6 is a cross sectional view of a plasma diffusion chamber around which twelve parallel wires are wound according to the present invention.

FIG. 6 is a cross sectional view depicting twelve parallel wires surrounding the plasma diffusion chamber. Here r denotes the distance from the center of the diffusion chamber to a selected point for purposes of calculating magnetic field strength and R denotes the radius from the center of the diffusion chamber to the outside wall of the diffusion chamber. Reference number 40 denotes a wire through which the current flows and reference number 42 denotes the plasma diffusion control chamber where a magnetic field plasma screening layer is formed by the current flowing through the parallel wires.

Preferably the wires 40 are at equal intervals to each other. In one exemplary embodiment of the present invention twelve wires 40 are used, although the invention is not limited thereto. For purposes of the conditions depicted in FIG. 7 a current of 10 ampere flows through each of the twelve wires. It is preferable that the current direction of the wire is parallel to the movement direction of the plasma.

Figure 7:
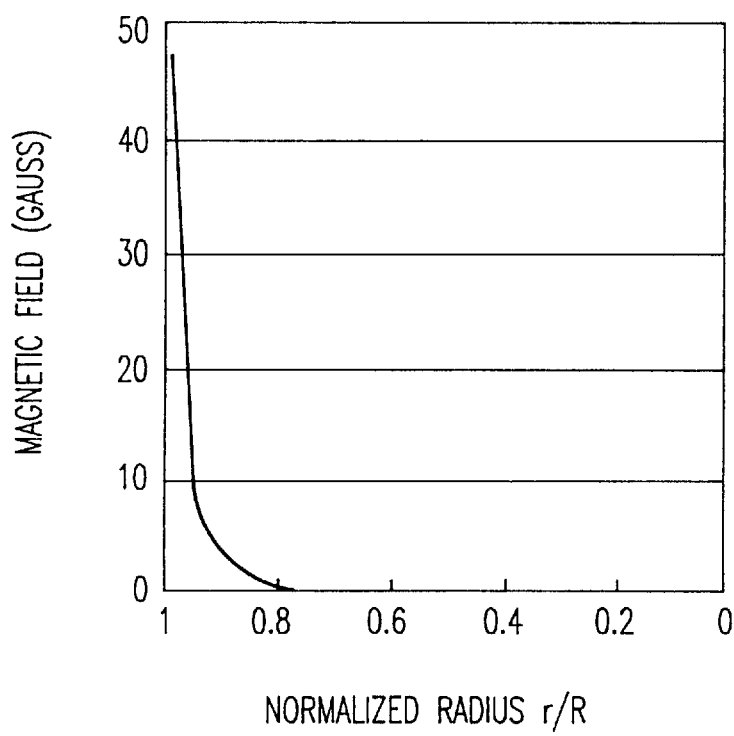
FIG. 7 is a graph depicting the change in strength of a magnetic field relative to the distance from the center of the plasma chamber when current flows along twelve wires according to the present invention.

The 10 amperes corresponds to a flow of electric charge in an amount equal to $3 \times 10^{10}$ esu/sec. When the diameter of wire 40 through which the current flows is 0.2 cm, the graph shown in FIG. 7 is obtained. It is preferable that each wire 40 be made of a thin and wide band shaped conductor.

The change in strength of the magnetic field in the direction of the plasma chamber center from the location of one of the wires is calculated by using a computer. Here r/R is a normalized radius which is a value indicating a selected distance from the chamber center as a ratio to the chamber radius. In this example, the strength of the magnetic field on the surface of the inner wall of the chamber is not less than 40 gauss, which is a magnetic field sufficient for configuring a screen between the channel wall and the diffusing plasma.

If the change in magnetic field strength is observed while moving from the surface of the chamber wall to the center of the chamber, the graph of FIG. 7 indicates that the strength of the magnetic field is rapidly reduced even at a distance only slightly separated from the surface of the chamber wall.

As shown in FIG. 7, the magnetic field approaches zero where the normalized radius r/R is at a value below about 0.8. In other words, the magnetic field exists in the region where r/R is above about 0.8. Based on the parameters of FIG. 7 the magnetic field used to constitute the magnetic field plasma screening layer effectively exists only in the neighborhood of the inner wall surface of the chamber to screen the plasma from the plasma chamber wall. The influence of the magnetic field in the central portion of the plasma chamber is negligibly small. Accordingly, the magnetic field, confined as it is to the inside edge of the plasma chamber, has no influence on the etching process so that changes in the magnetic field will not lead to damage during the etching process.

Figure 8:
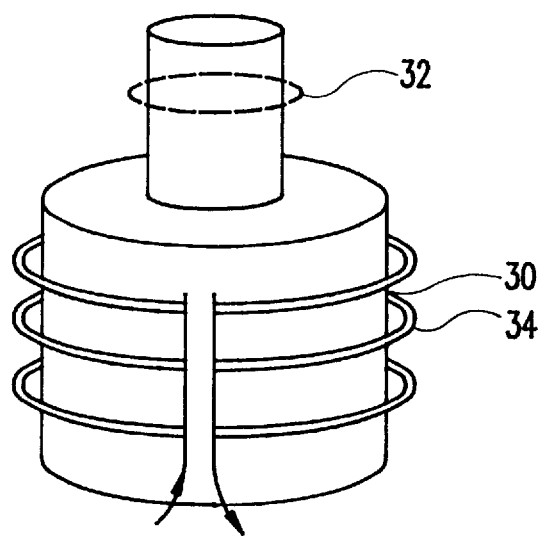
FIG. 8 is a perspective view of an apparatus of another embodiment according with the present invention.

According to another embodiment of the present invention in FIG. 8, the plurality of current-carrying wires 34 for providing the magnetic field plasma screening layer can be arranged in a direction parallel to the wall of the plasma diffusion chamber and perpendicular to the axial direction of the plasma chamber. This wire arrangement also provides a magnetic shielding for preventing the plasma flow from attaching to the wall of the plasma diffusion chamber.

In this embodiment, the current flow has an azimuthal direction and is still parallel to the wall 30 of the plasma diffusion chamber. The plurality of current-carrying wires 34 may be equidistantly arranged and may be made of a thin and wide band shaped conductor. The current path for providing a magnetic shielding may also be a sheet current path which is substantially the same shape as the plasma diffusion chamber wall.

The plan view of the wall of the plasma diffusion chamber may be a circle like that shown in FIG. 6, or it may be rectangular shaped or some other shape.

In the present invention, therefore, the magnetic field is formed in a direction parallel to the inner wall of the plasma diffusion chamber so that it is possible to prevent the diffusion of the plasma to the chamber wall. Also, since there is no region which is influenced by strong local magnetic fields perpendicular to the plasma chamber wall, it is possible to resolve the problems caused by considerable amounts of polymer deposition on the inner wall of the diffusion chamber. The avoidance of the polymer depositions consequently reduces the contamination in the diffusion chamber, facilitating equipment maintenance and extending equipment life.

The present invention is not limited to the above embodiment and many alterations can be made by those of ordinary skill in the art within the technical ideas of the present invention. Accordingly, the invention should be considered to include any and all configurations, modifications, variations, combinations, equivalent arrangements or expansions falling within the scope of the following claims.

What is claimed is:

1. A method of controlling plasma diffusion in a plasma diffusion chamber having a wall, comprising the steps of:
   (a) generating a plasma flow by a plasma generator; and
   (b) generating a magnetic field parallel to said wall of said plasma chamber by providing at least one current path in proximity to the plasma diffusion chamber wall, and applying current to the current path to form a plasma magnetic field screen in proximity to the plasma diffusion chamber wall, wherein the current path includes a plurality of current-carrying wires spaced around said plasma diffusion chamber and arranged in a direction parallel to said plasma diffusion chamber wall and parallel to an axial direction of the plasma diffusion chamber.

2. The method of claim 1, wherein said plasma flow is configured to follow a direction parallel to said plasma chamber wall.

3. The method of claim 2, wherein the current path includes a sheet current path which is substantially the same shape as the plasma diffusion chamber wall.

4. The method of claim 2, wherein said magnetic field is confined between said plasma diffusion chamber wall at distance r from the center of said plasma diffusion chamber, wherein R is the radius of the plasma diffusion chamber, such that r/R is greater than 0.8.

5. The method of claim 4, wherein said magnetic field is over 40 gauss in strength.

6. The method of claim 1, wherein each of the current-carrying wires is made of a thin and wide band shaped conductor.

7. The method of claim 1, further comprising the step of etching a semiconductor device within the plasma diffusion chamber.

8. A method of controlling plasma diffusion in a plasma diffusion chamber having a wall, comprising the steps of:
   (a) generating a plasma flow by a plasma generator; and
   (b) generating a magnetic field parallel to said wall of said plasma chamber by providing at least one current path in proximity to the plasma diffusion chamber wall, and applying current to the current path to form a plasma magnetic field screen in proximity to the plasma diffusion chamber wall, wherein the current path includes a plurality of current-carrying wires spaced around said plasma diffusion chamber and arranged in a direction parallel to said plasma diffusion chamber wall and perpendicular to an axial direction of the plasma diffusion chamber.

\* \* \* \* \*